(12) United States Patent
Manna et al.

(10) Patent No.: US 6,842,078 B2
(45) Date of Patent: Jan. 11, 2005

(54) RING OSCILLATOR WITH VARIABLE LOADING

(75) Inventors: Indrajit Manna, Singapore (SG); Lo Keng Foo, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/403,447

(22) Filed: Mar. 31, 2003

(65) Prior Publication Data

US 2004/0189407 A1 Sep. 30, 2004

(51) Int. Cl.⁷ .............................. H03L 7/00
(52) U.S. Cl. .................. 331/57; 331/36 C; 331/1 A; 331/108 C; 331/177 V
(58) Field of Search ................. 331/57, 36 C, 331/1 A, 108 C, 177 V; 327/290; 365/185.06

(56) References Cited

U.S. PATENT DOCUMENTS

| | | | |
|---|---|---|---|
| 5,625,288 A | 4/1997 | Snyder et al. ............ 324/158.1 |
| 5,963,102 A * | 10/1999 | Pang ........................... 331/57 |
| 6,097,255 A * | 8/2000 | Tachi .......................... 331/1 A |
| 6,320,474 B1 | 11/2001 | Kamiya et al. ......... 331/177 V |
| 6,396,358 B1 * | 5/2002 | Poss et al. ..................... 331/57 |
| 6,414,531 B2 * | 7/2002 | Brox ........................... 327/290 |
| 6,476,632 B1 | 11/2002 | La Rosa et al. ............ 324/769 |
| 6,574,140 B2 * | 6/2003 | Caywood ............... 365/185.06 |

OTHER PUBLICATIONS

Hayt Jr. et al. "Engineering Circuit Analysis" McGraw-Hill 1978 p. 155.*

* cited by examiner

Primary Examiner—Michael B Shingleton
(74) Attorney, Agent, or Firm—George D. Saile; Rosemary L.S. Pike; Douglas R. Schnabel (57) ABSTRACT

A ring oscillator circuit device is achieved. The device comprises an odd number of inverting stages. Each inverting stage has an input terminal and an output terminal. The inverter stages are coupled in a ring such that the output terminals of preceding inverting stages are coupled to the input terminals of subsequent inverting stages. A variable capacitor is included. The variable capacitor comprises a conductive layer overlying a bulk semiconductor region with a dielectric layer therebetween. The conductive layer is coupled to the output terminal of one of the inverting stages. The value of the variable capacitor depends on a bulk voltage that is coupled to the bulk semiconductor region. The ring oscillator is used for analyzing load dependence of hot carrier injection. The ring oscillator is used as a voltage-controlled oscillator in a phase-locked loop circuit.

12 Claims, 6 Drawing Sheets

RING OSCILLATOR WITH VARIABLE LOADING

BACKGROUND OF THE INVENTION

(1) Field of the Invention

The invention relates to a ring oscillator circuit in an integrated circuit device, and, more particularly, to a ring oscillator circuit with variable capacitance loading on internal nodes.

(2) Description of the Prior Art

Hot carrier injection is one of the major reliability wearout mechanisms in VLSI circuits. Currently, hot carrier robustness of a CMOS process is evaluated by stressing individual devices at high stress voltages and measuring the degradation of device parameters, such as drain current, over time. The cumulative degradation is then used to extrapolate device lifetimes, defined as a certain percentage degradation, based on the operating voltage. For example, the power supply may vary between the nominal VDD level and about 1.1 times the nominal VDD level.

As technologies are scaled down to the submicron range, the hot carrier effect increases dramatically. As a result, the degradation effects are more pronounced. As a further result, the above-described method, called static HCI testing, for estimating device lifetimes has become less meaningful and less realistic. The loss of correlation between testing and actual reliability is because the static test does not adequately take into account the amount of time that the hot carrier injection (HCI) effect occurs in a real circuit. For example, in a digital circuit that is synchronized with a clock, HCI may only occur during a small percentage of time during each clock cycle. Therefore, a static HCI test may over estimate the cumulative HCI effect. As a result, dynamic HCI test methods have been developed.

Figure 1:
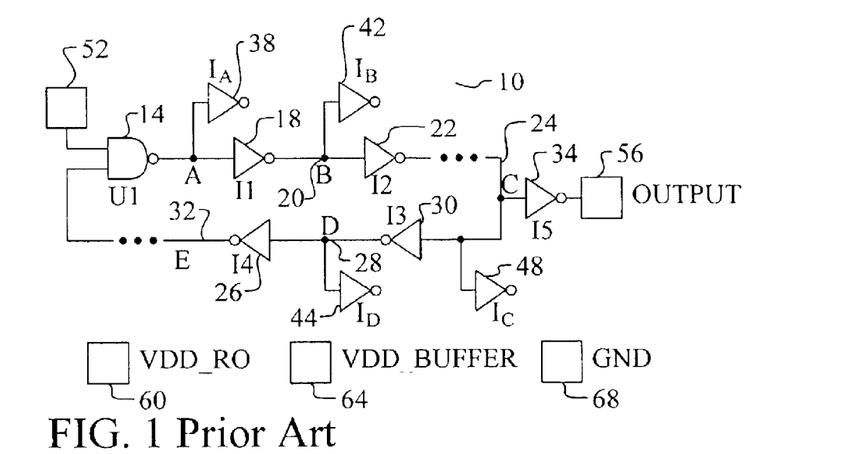
FIG. 1 illustrates a prior art ring oscillator circuit.

Referring now to FIG. 1, a ring oscillator circuit 10 is shown. The ring oscillator 10 comprises several inverting stages U1 14, I1 18, I2 22, I3 30, and I4 26 that are coupled together in a feedback ring. In this example, five stages are used in the ring. In practice, however, any odd number of stages can be used. Since an odd number of inverting stages, including the NAND gate U1 14, are used, the ring will oscillate whenever the enable signal ENABLE 52 is high. The frequency of oscillation, which is typically very high, will depend on the number of inverting stages in the ring and on the loading at each stage of the ring. Loading inverters $I_A$ 38, $I_B$ 42, $I_C$ 48, and $I_D$ 44 are included to simulate loads in a working circuit.

This ring oscillator circuit 10 can be used on an integrated circuit wafer as a dynamic HCI test structure. For example, the wafer may include an integrated circuit that is designed with transistors of the same length as the transistors in the ring oscillator circuit 10. The ring oscillator circuit 10 can then serve as a test vehicle to simulate HCI effects that the will occur in the product design. To test HCI, the circuit supply VDD_RO and the buffer VDD VDD_BUFFER are powered at a stressing voltage, such as 1.1 VDD, while GND 68 is grounded. ENABLE 52 is then forced high to allow the circuit to oscillate at a very high frequency. The output buffer I5 34 provides an additional loading and also drives the oscillation signal off-chip.

As the circuit 10 operates under the stressing voltage VDD_RO 60, any HCI effects will cause degradation of the transistor drain currents and the frequency of ring oscillator as a result. An accurate extrapolation compared to static HCI stress of operating lifetime is possible since the HCI effect is simulated under dynamic switching conditions. Changes in the oscillation frequency at the OUTPUT 56 can provide a measure of HCI-induced damaged.

A problem with this prior art ring oscillator 10 is that the loading on the circuit nodes A 16, B 20, C 24, and D 28 is a fixed value based on the transistor sizes in the load inverters $I_A$ 38, $I_B$ 42, $I_C$ 48, and $I_D$ 44. However, in the product design, a range of output loading is used. For example, in the product design, a first inverting stage may drive only a second inverting stage while the second inverting stage drives four inverting stages. In this case, the load on the second inverting stage is four times greater than the load on the first inverting stage. This situation is called fan-out. Fan-out can effect HCI degradation. Therefore, it is important to measure HCI over a range of fan-out conditions. However, since fixed inverter loads are used, it is not possible to study fan-out effects on HCI using a single ring oscillator circuit. To study the effect of fan-out on HCI degradation over the range of 1 to 5, five unique ring oscillator circuits would have to be designed and each circuit would require five pads as shown in FIG. 1. Therefore, such a study requires five circuits and 25 pads. Such an approach is very expensive in terms of test chip wafer area.

Several prior art inventions relate to ring oscillator structures. U.S. Pat. No. 6,476,632 B1 to LaRossa et al teaches a ring oscillator structure for use in on-chip reliability testing. A prior art circuit shows an inverter-based, ring oscillator having load capacitors at each stage. The preferred embodiment of the invention includes a plurality of pass gates to provide access to the internal nodes of the circuit. U.S. Pat. No. 5,625,288 to Snyder et al discloses ring oscillator circuits for generating high frequency signals for further use in high frequency stressing of on-chip devices. The ring oscillators are controlled by a DC current or a DC voltage. The voltage control is applied to the gate of the NMOS devices in the first and second inverters. U.S. Pat. No. 6,320,474 B1 to Kamiya et al describes a MOS variable capacitor that is used in a voltage controlled oscillator for driving a resonator or a crystal.

SUMMARY OF THE INVENTION

A principal object of the present invention is to provide an effective and very manufacturable ring oscillator circuit on an integrated circuit device.

A further object of the present invention is to provide a ring oscillator circuit useful for evaluating dynamic hot carrier effects.

A yet further object of the present invention is to provide a ring oscillator having a variable capacitive loading on internal nodes.

A yet further object of the present invention is to provide a ring oscillator where the capacitive loading may be varied using a voltage signal.

A yet further object of the present invention is to provide a ring oscillator circuit having a voltage-controlled oscillation frequency.

A yet further object of the present invention is to provide a phase locked loop circuit using a novel ring oscillator as a voltage-controlled oscillator.

Another further object of the present invention is to provide a method to test load dependence of a hot carrier injection effect in an integrated circuit device.

In accordance with the objects of this invention, a ring oscillator circuit device is achieved. The device comprises an odd number of inverting stages. Each inverting stage has an input terminal and an output terminal. The inverter stages are coupled in a ring such that the output terminals of preceding inverting stages are coupled to the input terminals of subsequent inverting stages. A variable capacitor is included. The variable capacitor comprises a conductive layer overlying a bulk semiconductor region with a dielectric layer therebetween. The conductive layer is coupled to the output terminal of one of the inverting stages. The value of the variable capacitor depends on a bulk voltage that is coupled to the bulk semiconductor region.

Also in accordance with the objects of this invention, a phase locked loop circuit device is achieved. The device comprises a phase detector having a first input terminal, a second input terminal, and an output terminal. The output terminal carries a signal equal to a constant voltage plus a voltage proportional to a phase error between the first and second input terminals. The first input terminal is coupled to a periodic signal. A low pass filter having an input terminal and an output terminal is used. The low pass filter input terminal is coupled to the phase detector output terminal. A voltage controlled oscillator circuit is included. This voltage controlled oscillator circuit comprises an odd number of inverting stages. Each inverting stage has an input terminal and an output terminal. The inverter stages are coupled in a ring such that the output terminals of preceding inverting stages are coupled to the input terminals of subsequent inverting stages. A variable capacitor comprises a conductive layer overlying a bulk semiconductor region with a dielectric layer therebetween. The conductive layer is coupled to the output terminal of one of the inverting stages. The value of the variable capacitor depends on a bulk voltage that is coupled to the bulk semiconductor region. The bulk voltage is further coupled to the low pass filter output terminal. A buffer stage has an input terminal that is coupled to the output terminal of one of the inverting stages and has an output terminal. Finally, a frequency divider has an input terminal and an output terminal. The input terminal is coupled to the buffer stage output terminal. The output terminal is coupled to the phase detector second input terminal.

Also in accordance with the objects of this invention, a method to test load dependence of a hot carrier injection effect in an integrated circuit device is achieved. The method comprises providing a ring oscillator circuit on an integrated circuit device. The circuit comprises an odd number of inverting stages. Each inverting stage has an input terminal and an output terminal. The inverter stages are coupled in a ring such that the output terminals of preceding inverting stages are coupled to the input terminals of subsequent inverting stages. A variable capacitor comprises a conductive layer overlying a bulk semiconductor region with a dielectric layer therebetween. The conductive layer is coupled to the output terminal of one of the inverting stages. The value of the variable capacitor depends on a bulk voltage that is coupled to the bulk semiconductor region. The inverting stages are powered with a stressing voltage. Frequencies of the ring oscillator circuit are measured while stepping the bulk voltage through a range of values to determine load dependence of a hot carrier injection effect in the integrated circuit device.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a ring oscillator circuit device having variable loading. The circuit is particularly useful for testing HCI effects over a variety of loading conditions. Further, a phase-locked loop using the ring oscillator is disclosed. It should be clear to those experienced in the art that the present invention can be applied and extended without deviating from the scope of the present invention.

Figure 2:
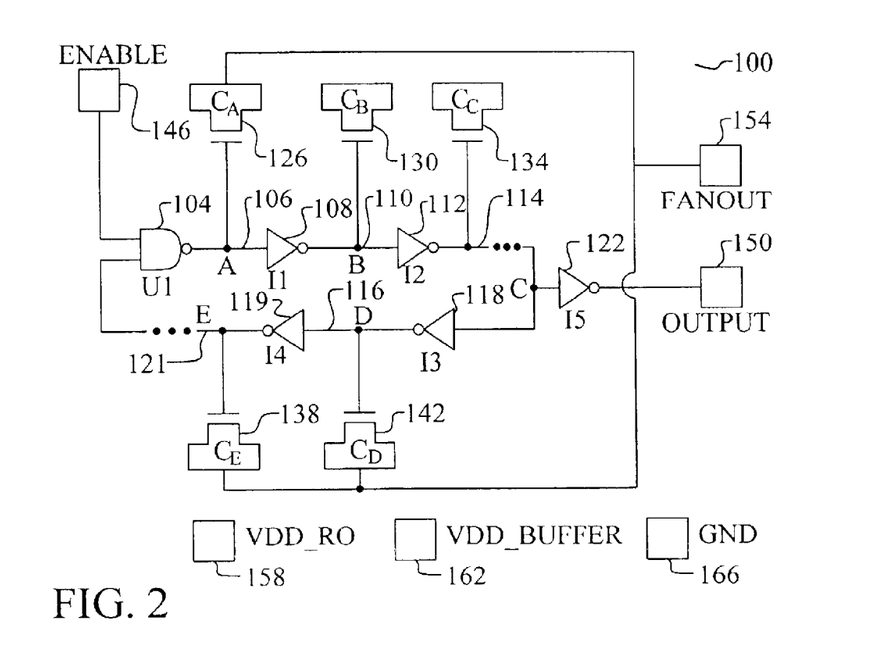
FIG. 2 illustrates a first preferred embodiment of the present invention showing a ring oscillator having variable capacitor loading.

Referring now to FIG. 2, the first preferred embodiment of the present invention is illustrated. Several important features of the present invention are shown and discussed below. The first preferred embodiment of the present invention comprises a ring oscillator circuit 100. The circuit device 100 comprises an odd number of inverting stages U1 104, I1 108, I2 112, I3 118, and I4 119. Five stages are shown in the ring as an example. However, any odd number of stages can be used. Each inverting stage has an input terminal and an output terminal. The inverter stages are coupled in a ring such that the output terminals of preceding inverting stages are coupled to the input terminals of subsequent inverting stages. At least one variable capacitor $C_A$ 126 is included. In the more preferred case, a plurality of variable capacitors $C_A$ 126, $C_B$ 130, $C_C$ 134, $C_D$ 142, and $C_E$ 138, are used. One variable capacitor is coupled to the output terminal of each inverting stage.

Figure 3:
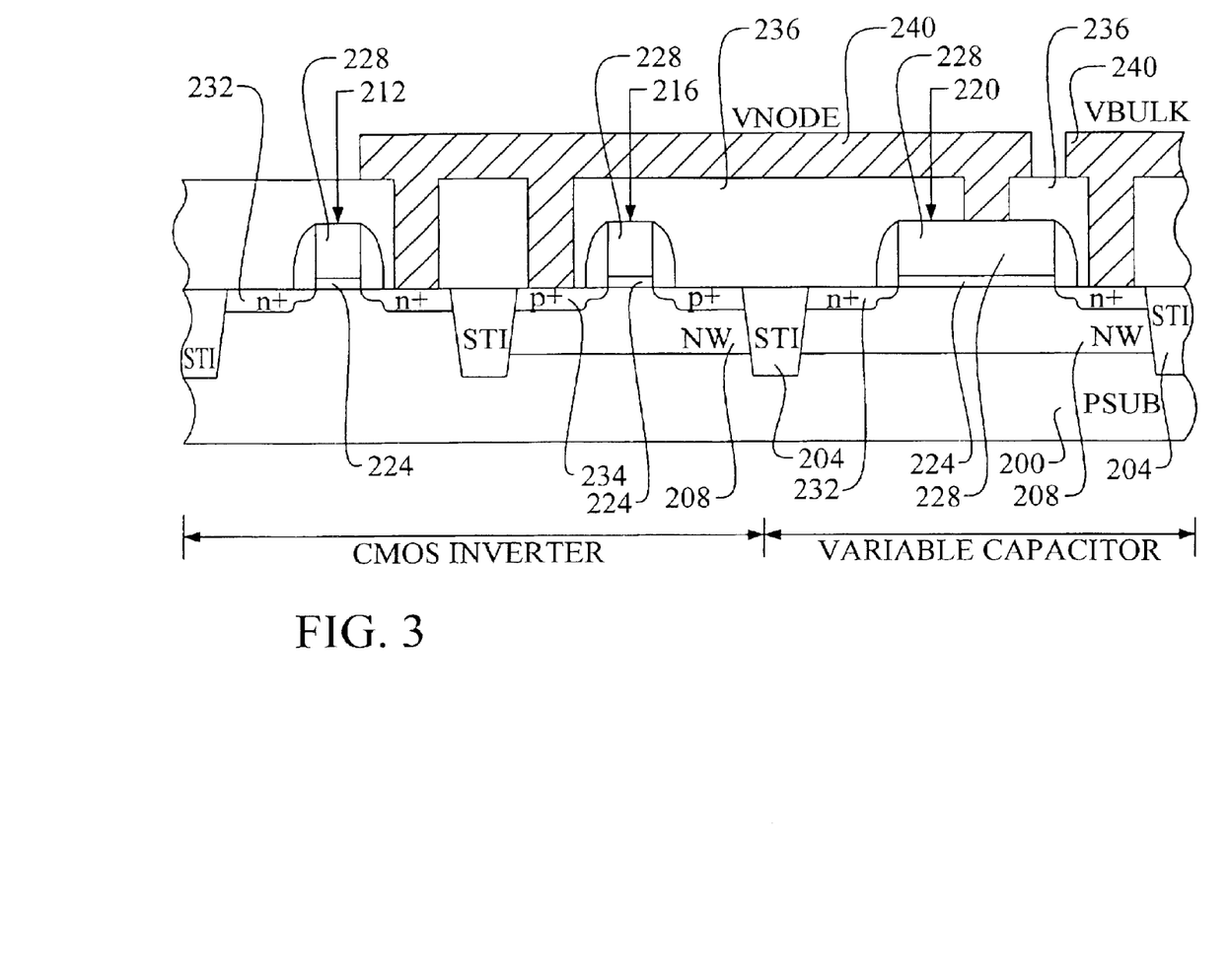
FIG. 3 illustrates the first preferred embodiment of the present invention in a cross section of an integrated circuit device. A variable capacitor is shown integrated with a CMOS inverter.

The variable capacitors $C_A$ 126, $C_B$ 130, $C_C$ 134, $C_D$ 142, and $C_E$ 138 preferably comprise MOS capacitors where the gate electrode is coupled to the inverting stage output terminal. The bulk terminal of each MOS capacitor is coupled to a bulk voltage FANOUT 154. Referring to FIG. 3, the first preferred embodiment of the present invention is illustrated in a cross section of an integrated circuit device. The variable capacitor 220 is shown integrated with a CMOS inverter comprising MOS transistors 212 and 216. The variable capacitor 220 comprises a conductive layer 228 overlying a bulk semiconductor region 208 with a dielectric layer 224 therebetween. Preferably, the conductive layer 228 comprises polysilicon and the dielectric layer 224 comprises an oxide.

The MOS transistors 212 and 216 and the MOS capacitor 220 are formed on a substrate 200. The substrate 200 preferably comprises monocrystalline silicon. In this embodiment, the substrate 200 is p-type. N-type wells (NW)

208 are formed in the substrate for the bulk region 208 of the PMOS device 216 and for the bulk region 208 of the MOS capacitor 220. Alternatively, a dual-well approach may be used where a p-type well (PW) is formed for the bulk region of the NMOS device 212. Preferably, the gates of the NMOS 212 and the PMOS 216 are formed using the same conductive layer 228 and dielectric layer 224 as used for the MOS capacitor.

The conductive layer 228 of the MOS capacitor is coupled to the output terminal VNODE of the inverting stage formed by the coupling of the PMOS device 216 and the NMOS device 212 by the metal layer 240. Of particular importance, the bulk region 208 and the source/drain regions 232 of the MOS capacitor are n-type. The p-type substrate 200 is typically biased to the lowest voltage on the integrated circuit GROUND. By forming the MOS capacitor bulk 208 as n-type, this bulk connection can be biased to any positive voltage between GROUND and the reverse breakdown voltage of the NW/PSUB junction.

Figure 4:
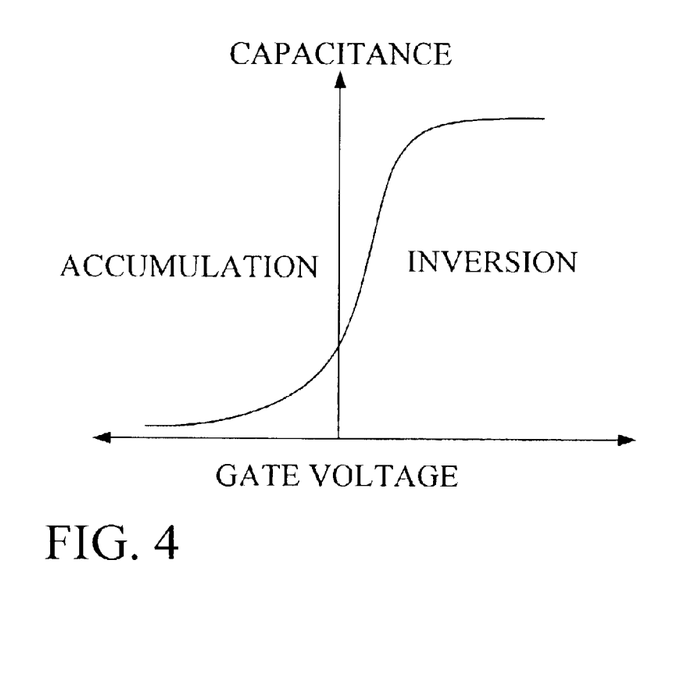
FIG. 4 illustrates the capacitance variation of a MOS capacitor over a range of gate voltages.

Referring now to FIG. 4, the capacitance variation of a MOS capacitor over a range of gate voltages is illustrated. The gate voltage of the MOS capacitor, with respect to the voltage of the bulk region, is swept from a negative value to a positive value. When the gate voltage is negative, the channel region under the gate is in the accumulation mode. Alternatively, this mode of operation corresponds to the bulk region biased to a positive voltage, such as VDD, while the gate is biased to ground. In the accumulation mode, the capacitance value is low. When the gate voltage is positive, the channel region under the capacitor gate is in inversion. Alternatively, this mode of operation corresponds to the bulk region biased to ground while the gate is biased to VDD. In the inversion mode, the capacitance value is high. It can be seen from the performance curve of the MOS capacitor that the variable capacitance value can be controlled by the voltage on the bulk region. This is an important feature of the present invention.

Referring again to FIG. 2, as an important feature, the bulk regions of the MOS capacitors $C_A$ 126, $C_B$ 130, $C_C$ 134, $C_D$ 142, and $C_E$ 138 are coupled together to the FANOUT signal 154. The values of the variable capacitors are controlled by the bias voltage on the FANOUT signal 154 using the variable capacitance property described above. To set the capacitors on nodes A 106, B 110, C 114, D 116, and E 121 to smallest values, the FANOUT voltage is biased to a positive voltage such as VDD. To set the capacitors to the largest values, the FANOUT voltage is biased to ground. Further, the FANOUT voltage can be set to any voltage between VDD and ground to achieve an intermediate loading.

The circuit 100 of the first embodiment allows a range of capacitance loading on each node of the ring oscillator through the use of a single circuit design. The circuit 100 further comprises a stressing voltage input, VDD_RO 158, a buffer voltage input, VDD_BUFFER 162, a ground input GND 166, and enable input ENABLE 146, and an output OUTOUT 150. The NAND gate U1 104 allows the oscillator to be turned ON and OFF by the ENABLE signal 146. A buffer I5 122 couples the ring oscillator to the output 150.

Figure 5:
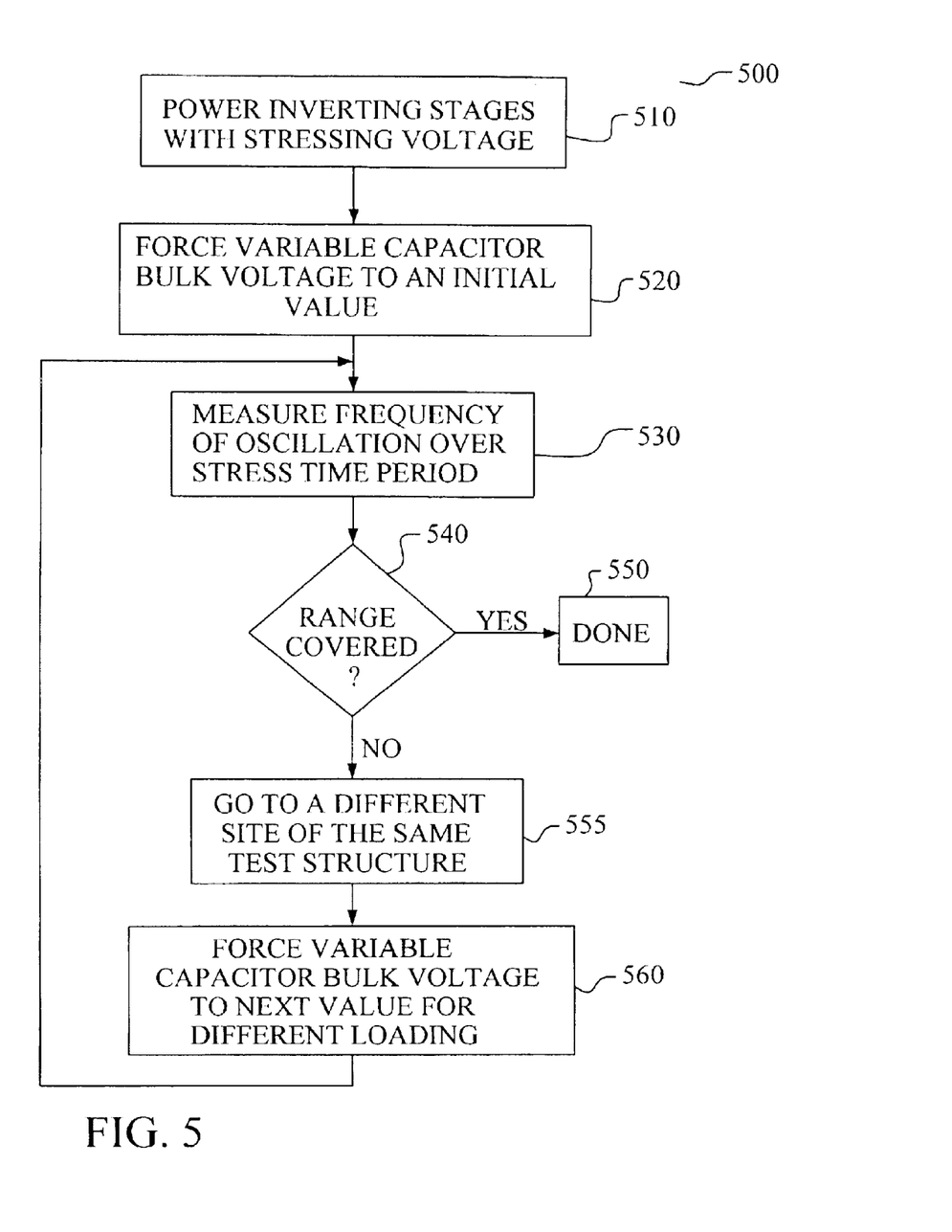
FIG. 5 illustrates a second preferred embodiment of the present invention showing a method to test load dependence of a hot carrier injection effect in an integrated circuit device.

Referring now to FIG. 5, a second preferred embodiment of the present invention is illustrated. A method 500 to test load dependence of a hot carrier injection effect in an integrated circuit device using the above-described test structure is shown. The method 500 comprises powering the inverting stages with a stressing voltage in step 510. For example, the ring oscillator supply, VDD_RO 158, is powered at a voltage exceeding the nominal supply, such as 1.1 times the VDD level. This elevated VDD level will cause elevated levels of HCI to occur. Next, an initial bulk voltage is biased on the FANOUT signal 154 in step 520. The frequency of the ring oscillator circuit is then measured over the stressing time period in step 530. If the bulk voltage range has not been covered, then the bulk voltage is incremented to a new value in steps 555 and 560 to thereby change the capacitor loading in the ring oscillator in steps 540 and 550 prior to measuring the oscillation frequency again in step 530. This sequence is repeated until the range of bulk voltages is covered in step 550.

The method 500 allows the loading on each inverter stage in the ring oscillator to be varied across a range. At the largest bulk voltage value (VDD), the MOS capacitors are in accumulation for most of the oscillation cycle. For typical frequencies of operation, the resulting MOS capacitor value is quite low. At the smallest bulk voltage value (GND), the MOS capacitors are in inversion for most of the oscillation cycle. For typical frequencies of operation, a large capacitance is added to each node. Further, the loading of each stage can be smoothly incremented over a range of values by sweeping the FANOUT voltage from VDD to GND. The HCI effect can thereby be measured over a range of loading, or fanout, conditions in the ring oscillator. This range of conditions is accomplished without proliferating ring oscillator test circuits and without proliferating pads. One circuit with six pads can test a range of conditions.

Figure 6:
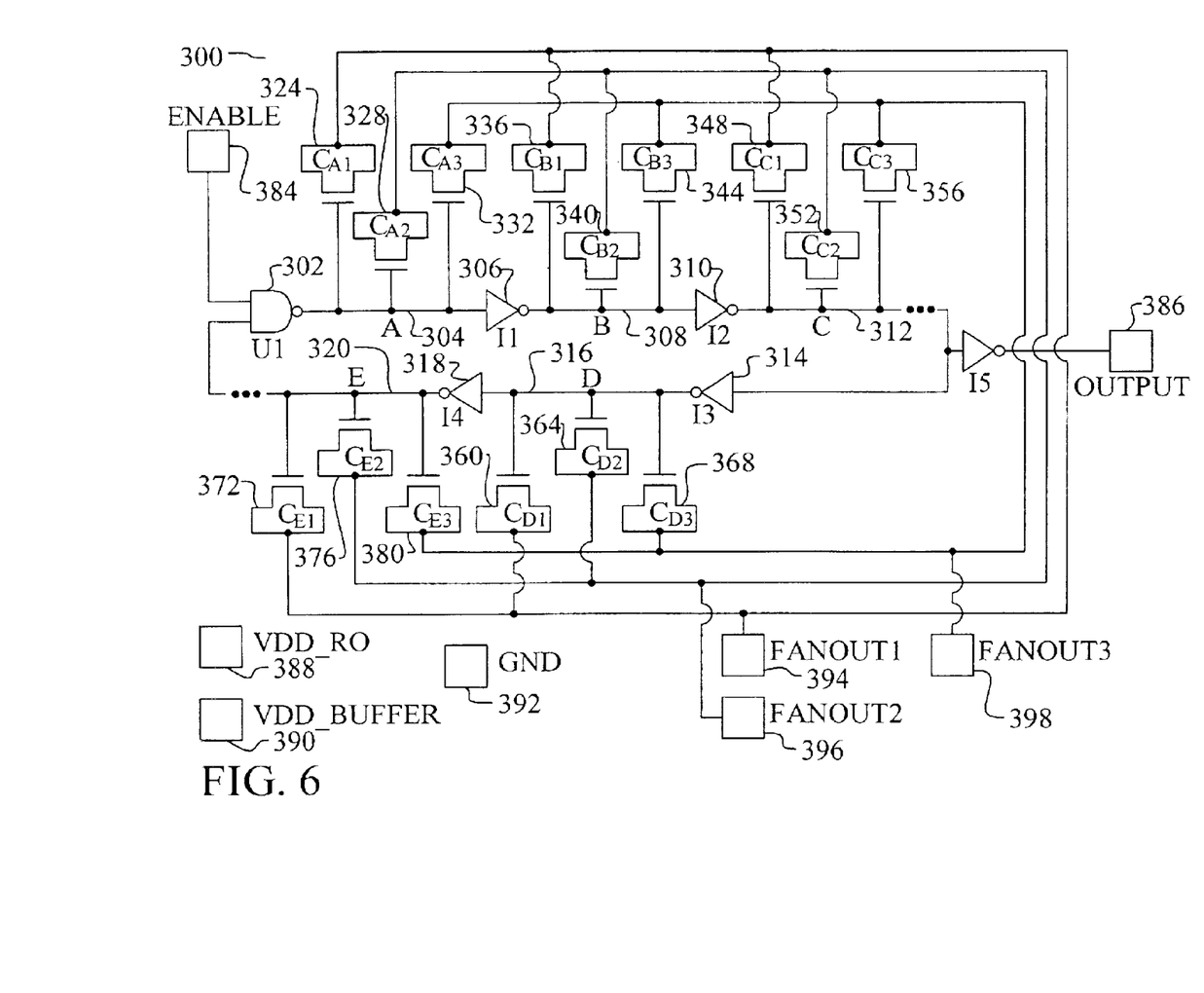
FIG. 6 illustrates a third preferred embodiment of the present invention showing the ring oscillator with multiple variable capacitors on each node.

Referring now to FIG. 6, a third preferred embodiment of the present invention is illustrated. In this embodiment, multiple MOS capacitors are coupled to each node in the ring oscillator circuit 300. Once again, an odd number of inverting stages U1 302, I1 306, I2 310, I3 314, and I4 318 are used. Once again, five stages are shown in the ring. However, any odd number of stages can be used. In this case, however, each node A 304, B 308, C 312, D 316, and E 320, between the inverting stages is coupled to three capacitors. Node A 304 is coupled to MOS capacitors $C_{A1}$ 324, $C_{A2}$ 328, and $C_{A3}$ 332. Node B 308 is coupled to MOS capacitors $C_{B1}$ 336, $C_{B2}$ 340, and $C_{B3}$ 344. Node C 312 is coupled to MOS capacitors $C_{C1}$ 348, $C_{C2}$ 352, and $C_{C3}$ 356. Node D 316 is coupled to MOS capacitors $C_{D1}$ 360, $C_{D2}$ 364, and $C_{D3}$ 368. Node E 320 is coupled to MOS capacitors $C_{E1}$ 372, $C_{E2}$ 376, and $C_{E3}$ 380.

The bulk regions of the capacitors are coupled to one of several signals. In this example, there are three bulk voltage signals, FANOUT1 394, FANOUT2 396, and FANOUT3 398. By carefully designing the size of the MOS capacitors, and by biasing the FANOUT1 394, FANOUT2 396, and FANOUT3 398 signals appropriately, a much larger range of fanout conditions can be created. In addition, by adding more fanout pads, additional fanout scenarios can be created. For example, if all the bulk voltages FANOUT1 394, FANOUT2 396, and FANOUT3 398 are forced to VDD, such that capacitors are at lowest values, then a very low capacitance loading is attached to each node. At the other extreme, if all of the bulk voltages FANOUT1 394, FANOUT2 396, and FANOUT3 398 are forced to GND, such that capacitors are at highest values, then a large capacitance loading is attached to each node. Further, a large range of values between these extremes can be evaluated by biasing the bulk voltages to different values.

In general, this technique requires five standard pads plus one pad for each fanout capacitor. In the above case, the five standard pads are VDD_RO 388, VDD_BUFFER 390, GND 392, ENABLE 384, and OUTPUT 386. Since there are three independent, fanout capacitors per node, there are three fanout control signals shown as FANOUT1 394, FANOUT2 396, and FANOUT3 398. To perform an analysis over a fanout range of 1–10 would require five standard pads plus ten fanout pads. However, only one ring oscillator circuit is needed. In addition, the MOS capacitors can be designed in different sizes. For example, five fanout capacitors can be sized such that three capacitors are of smallest area, one capacitor is twice the smallest area, and one capacitor is five times the smallest area. In that case, only five fanout pads are required to select a fanout loading between 1 and 10 in steps of 1. This technique provides a single ring oscillator capable of analyzing a large fanout range and results in very significant area savings.

Referring again to FIG. 2, the ring oscillator 100 with variable capacitor loading can be used as a voltage-controlled oscillator. As the capacitance loading $C_A$ 126, $C_B$ 130, $C_C$ 134, $C_D$ 142, and $C_E$ 138 on each node A 106, B 110, C 114, D 116, and E 121 varies, the resulting frequency of oscillation of the circuit also varies. Increasing capacitance reduces operating frequency and visa versa. Therefore, the ring oscillator of the present invention forms a voltage-controlled oscillator (VCO) where the bulk voltage, in this case FANOUT 154, controls the frequency of operation. This VCO circuit 100 can take the form of a single variable capacitor on any inverting stage, one variable capacitor on each inverting stage (as shown), or multiple variable capacitors on each inverting stage (as shown in FIG. 6).

Figure 7:
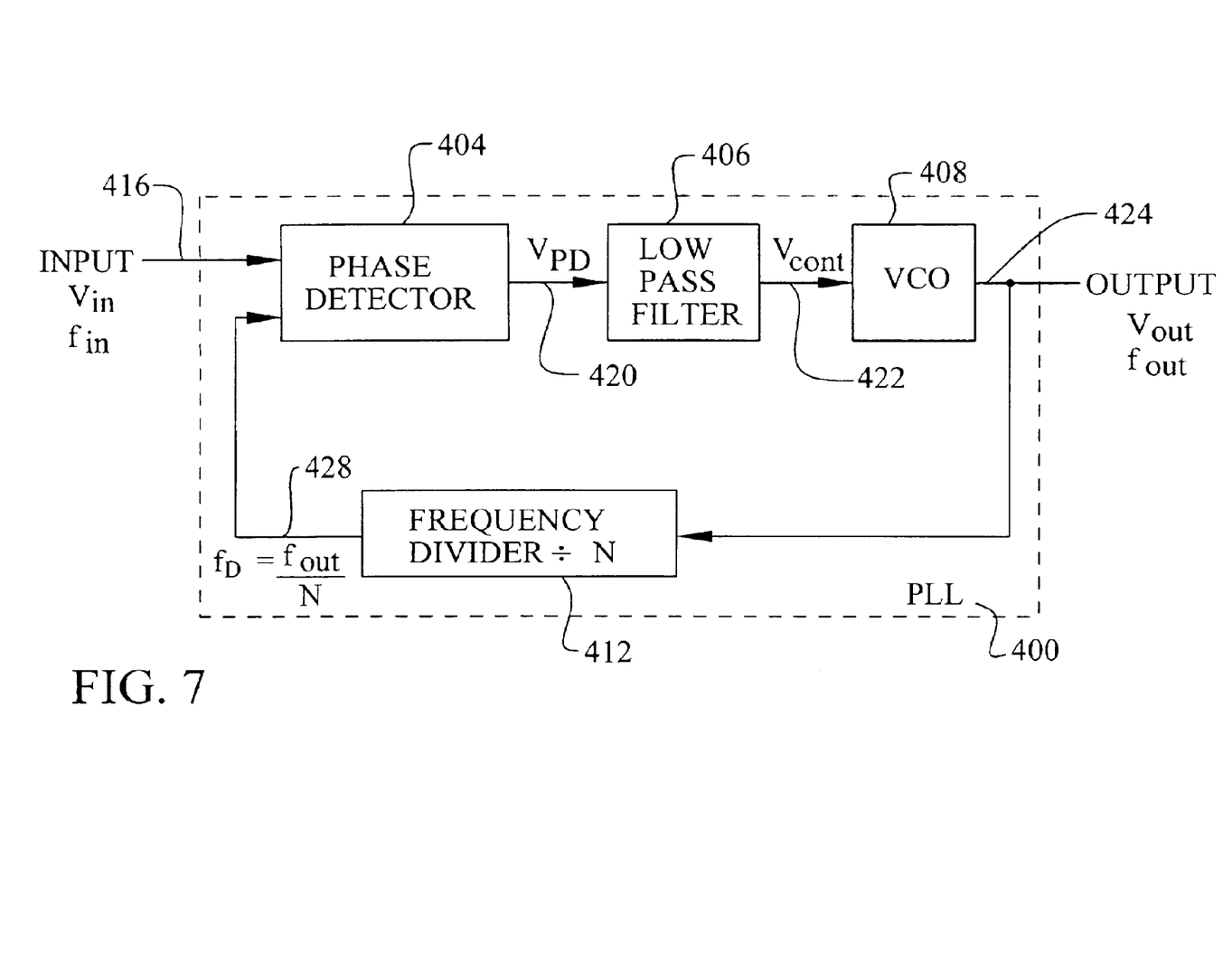
FIG. 7 illustrates a fourth preferred embodiment of the present invention showing a phase locked loop (PLL) circuit where the ring oscillator of the present invention is used as the voltage controlled oscillator (VCO).

Referring now to FIG. 7, the novel VCO circuit can further be applied to a phase-locked loop (PLL) circuit 400. This general PLL diagram uses a VCO 408 in combination with a frequency divider 412, a low-pass filter 406, and a phase detector 404. The VCO circuit 408 generates an output signal, OUTPUT 424, having a frequency that is equal to the frequency of an input signal, INPUT 416, multiplied by a constant N. Further, the output signal 424 is synchronized (phase-locked) to the input signal 416. A feedback loop is used to generate an error signal $V_{PD}$ 420 which is converted into a DC control voltage $V_{cont}$ 422 that is used to control the VCO 408. The unique VCO circuit 408 of the present invention allows the PLL circuit 400 to synchronize the output frequency 424 to the input signal 416 more quickly than prior art VCO circuits. This because the variable loading ring oscillator can move the frequency in larger steps during the initial phase lock when the output frequency is completely out of locking range.

The advantages of the present invention may now be summarized. An effective and very manufacturable ring oscillator circuit is achieved. The ring oscillator circuit is particularly useful for evaluating hot carrier effects. The ring oscillator has a variable capacitive loading on internal nodes. This capacitive loading may be varied using a voltage signal. The ring oscillator circuit has a voltage-controlled oscillation frequency. A phase locked loop circuit using the novel ring oscillator as a voltage-controlled oscillator is achieved. A method to test load dependence of a hot carrier injection effect in an integrated circuit device is achieved. The method allows a large fanout range to be studied using a single ring oscillator circuit.

As shown in the preferred embodiments, the novel circuit device and method of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A ring oscillator circuit device comprising:

an odd number of inverting stages wherein each said inverting stage has an input terminal and an output terminal and wherein said inverter stages are coupled in a ring such that said output terminals of preceding said inverting stages are coupled to said input terminals of subsequent said inverting stages wherein one of said inverting stages comprises a logic gate having an additional input terminal that is coupled to an enable signal;

a plurality of first variable capacitors wherein each said output terminal of each said inverting stage is coupled to one of said first variable capacitors and wherein all said first variable capacitor bulk semiconductor regions are coupled to a first bulk voltage; and a plurality of second variable capacitors wherein each said output terminal of each said inverting stage is coupled to one of said second variable capacitors and wherein all said second variable capacitor bulk semiconductor regions are coupled to a second bulk voltage wherein said enable signal, said first bulk voltage, and said second bulk voltage are accessible for probe testing via pad structures.

2. The device according to claim 1 wherein said invertinq stages comprise CMOS inverters.

3. The device according to claim 1 further comprising a buffer stage having an input terminal that is coupled to said output terminal of one of said inverting stages and an output terminal that is the output of said device.

4. The device according to claim 1 wherein said conductive layer comprises polysilicon and wherein said dielectric layer comprises oxide.

5. A method to test load dependence of a hot carrier injection effect in an integrated circuit device comprising:

providing a ring oscillator circuit on an integrated circuit device, said circuit comprising:
an odd number of inverting stages wherein each said inverting stage has an input terminal and an output terminal and wherein said inverter stages are coupled in a ring such that said output terminals of preceding said inverting stages are coupled to said input terminals of subsequent said inverting stages; and
a variable capacitor comprising a conductive layer overlying a bulk semiconductor region with a dielectric layer therebetween, wherein said conductive layer is coupled to said output terminal of one of said inverting stages and wherein the value of said variable capacitor depends on a bulk voltage that is coupled to said bulk semiconductor region; powering said inverting stages with a stressing voltage;

measuring frequencies of said ring oscillator circuit while stepping said bulk voltage through a range of values to determine load dependence of a hot carrier injection effect in said integrated circuit device.

6. The method according to claim 5 wherein said inverting stages comprise CMOS inverters.

7. The method according to claim 5 further comprising a plurality of said variable capacitors wherein each said output terminal of each said inverting stage is coupled to one said variable capacitor and wherein all said variable capacitor bulk semiconductor regions are coupled to a said bulk voltage.

8. The method according to claim 7 further comprising a second plurality of said variable capacitors wherein each said output terminal of each said inverting stage is further coupled to said conductive layer of one of said variable capacitors of said second plurality and wherein a second bulk voltage is coupled to all of said bulk semiconductor regions of said second plurality.

9. The method according to claim 8 wherein said step of measuring frequencies of said ring oscillator circuit further comprises stepping said second bulk voltage through a range of values.

10. The method according to claim 5 wherein one of said inverting stages comprises a logic gate having an additional input terminal that is coupled to an enable signal.

11. The method according to claim 5 further comprising a buffer stage having an input terminal that is coupled to said output terminal of one of said inverting stages and having an output terminal that is an output of said device.

12. The method according to claim 5 further comprising a plurality of pad structures providing external access to circuit nodes for testing.

* * * * *